(12) United States Patent
Subramaniam et al.

(10) Patent No.: US 9,123,444 B2
(45) Date of Patent: Sep. 1, 2015

(54) METHOD OF TESTING COHERENCY OF DATA STORAGE IN MULTI-PROCESSOR SHARED MEMORY SYSTEM

(71) Applicants: Eswaran Subramaniam, Bangalore (IN); Vikas Chouhan, Keonjhar (IN)

(72) Inventors: Eswaran Subramaniam, Bangalore (IN); Vikas Chouhan, Keonjhar (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 17 days.

(21) Appl. No.: 14/170,652

(22) Filed: Feb. 3, 2014

(65) Prior Publication Data

US 2015/0221396 A1 Aug. 6, 2015

(51) Int. Cl.
*G11C 29/00* (2006.01)
*G11C 29/10* (2006.01)
*G06F 11/263* (2006.01)
*G06F 11/22* (2006.01)

(52) U.S. Cl.
CPC ............ *G11C 29/10* (2013.01); *G06F 11/2242* (2013.01); *G06F 11/2635* (2013.01)

(58) Field of Classification Search
None
See application file for complete search history.

(56) References Cited

U.S. PATENT DOCUMENTS

| 5,355,471 | A   | * | 10/1994 | Weight ............................ 714/10 |
| 6,567,934 | B1  | * | 5/2003  | Yen et al. ........................ 714/33 |
| 7,434,002 | B1  | * | 10/2008 | Zedlewski et al. ............ 711/130 |
| 7,581,064 | B1  | * | 8/2009  | Zedlewski et al. ............ 711/118 |
| 7,661,023 | B2  |   | 2/2010  | Arora et al. |
| 7,747,908 | B2  |   | 6/2010  | Choudhury |
| 8,352,791 | B2  |   | 1/2013  | Hommes |
| 2009/0024877 | A1 | * | 1/2009 | Choudhury et al. ............ 714/43 |
| 2009/0024891 | A1 | * | 1/2009 | Choudhury et al. .......... 714/738 |
| 2009/0024892 | A1 | * | 1/2009 | Bussa et al. ................... 714/738 |
| 2010/0011345 | A1 | * | 1/2010 | Hickerson et al. ............ 717/130 |

* cited by examiner

*Primary Examiner* — Daniel McMahon
(74) *Attorney, Agent, or Firm* — Charles Bergere

(57) ABSTRACT

A method of testing the coherency of data storage in a memory shared by multiple processor cores through core interconnects in a device under test (DUT) includes running test patterns including data transactions between the processor cores and the shared memory, and comparing the results of the data transactions with expected results. The test patterns include false sharing operations and irritator operations causing memory thrashing.

15 Claims, 4 Drawing Sheets

METHOD OF TESTING COHERENCY OF DATA STORAGE IN MULTI-PROCESSOR SHARED MEMORY SYSTEM

BACKGROUND

The present invention is directed to multi-processor systems and, more particularly, to testing the coherency of data stored in a memory shared by the processor cores through core interconnects.

In multi-processor systems with shared memory, two or more processing cores operate at the same time and can access simultaneously common memory locations. Precautions are taken so that when one of the processor cores has updated data at a common location, the other cores will not work on stale (out-of-date) data. The need for coherency exists whether the data is an operand or an instruction.

Multi-processor systems typically include caches, in which case precautions are taken that data copied into the caches remains coherent with the data in the corresponding main memory location and derived data in other locations. The precautions typically include enabling each processor core to have information whether the data in a particular memory location is the most recent updated data and various parameters are included in the caching structures to indicate the various potential states of cached data.

The complexity of the interactions between the different processor cores and the shared memory, caches and interconnects requires verification by testing the hardware design for multi-core cache-memory coherency scenarios under stress. Automatic test equipment (ATE) including a test pattern generator can apply test patterns of instructions to physical devices in order to identify causes of lack of data integrity. However, defective operations (bugs) are sufficiently few and far between for test run times to be excessively long before such bugs occur. Thus, there is a need for a test method that stresses shared memory and interconnects with the caches and processor cores by producing frequent and rapid transitions of state in the memory components, and heavy traffic and contention on the interconnects, in order for the bugs to appear with shorter test runs.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION OF THE INVENTION

Figure 1:
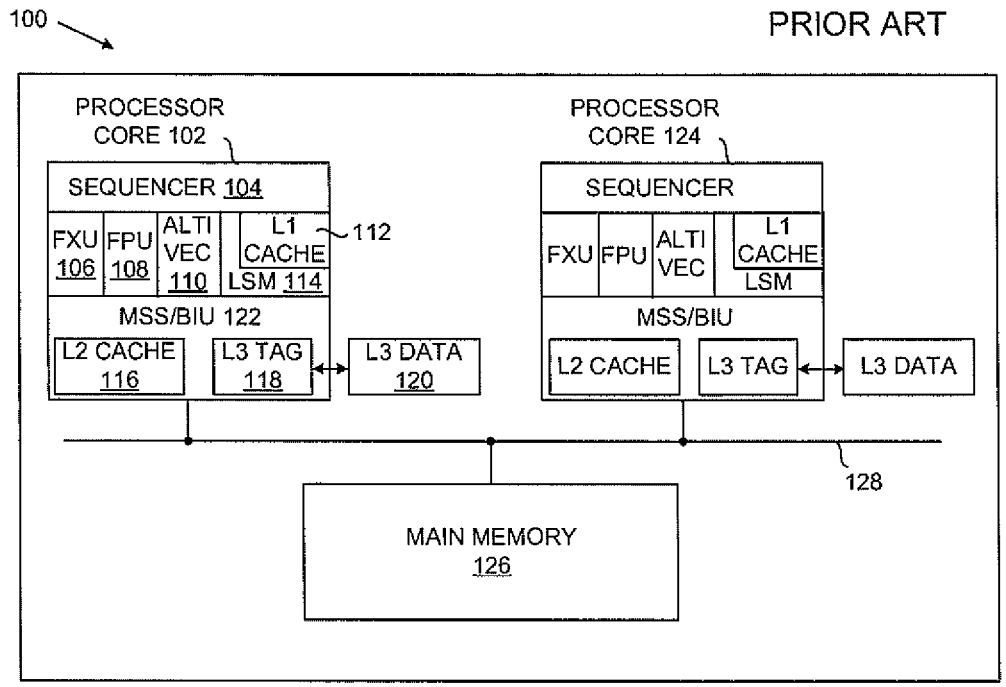
FIG. 1 is a schematic block diagram of a conventional processor device.

FIG. 1 illustrates an example of a processor 100 whose operation can be tested by a method in accordance with the present invention. The device 100 has a plurality of processor cores 102, 124 sharing memory 126 through core interconnects including a bus 128. Two processor cores 102, 124 are shown in FIG. 1 but it will be appreciated that the processor 100 could have more than two processor cores. The processor 100 is shown with shared main memory 126 and also has caches 112, 116, and 118, 120. It will be appreciated that the caches 112, 116, and 118, 120 may be individual caches for respective processor cores, as shown, or at least some of the caches, such as level three (L3) caches 118, 120, may also be shared memory for at least some of the processor cores 102, 124.

In this example of the processor 100, the processor cores 102, 124 have similar structure, which is described with reference to the processor core 102, for simplicity. The processor core 102 has a sequencer 104 that fetches instructions and dispatches the instructions and operands to the appropriate execution units in the proper order. The execution units of the processor 100 include a fixed-point execution unit (FXU) 106 that performs integer operations, a floating point unit (FPU) 108 that performs floating point operations, an AltiVec block 110 that executes multimedia instructions, and a load store module (LSM) 114 that performs load and store operations with respect to the memory 126. The LSM 114 interacts with the bus 128 and the memory 126 using a memory subsystem/bus interface unit (MSS/BIU) 122 included in the processor core.

The processor 100 shown in FIG. 1 includes three caches for each processor core 102, 124. A level one (L1) cache 112 is included in the LSM 114. The L1 cache is of relatively limited size, and provides efficient and rapid access to the data cached in it corresponding to the most recently accessed memory locations. The MSS/BIU 122 includes a level two (L2) cache 116 that provides a slower speed of access than the L1 cache 112, but is typically much larger in size. The MSS/BIU 122 also includes a tag portion 118 of a level three (L3) cache. The L3 cache is very large, so only the tag portion 118 is included in the processor core, and includes the control circuitry associated with the L3 cache. The data portion of the L3 cache 120 is a memory structure external to the processor core and may be coupled to the processor 100 via a backside bus.

The caches are typically set-associative, rather than directly mapped or fully associative. A set-associative cache address includes a tag including the identification (ID), a set index and a block offset.

Data integrity verification techniques employed by the processor cores 102 and 124 may include maintaining an indication of the cache state for each cached location or group of locations. One example system distinguishes the following cache states. An exclusive-modified state indicates that the cache location to which that state corresponds is exclusively controlled by that cache, and that the data corresponding to that location has been modified since it was loaded from the bus 128. An exclusive-not-modified state indicates that although the cache is the exclusive controller of that particular address, the data corresponding to that address has not been modified. A shared cache state indicates that more than one processor is currently storing data corresponding to that address in its cache structure. An invalid cache state indicates that the data stored at that cache location is invalid, and most likely does not match the true current value corresponding to the address of that cache location. The transitions between these various states are complex, and the support of such transitions requires complex multiprocessing hardware design logic that, if not properly tested and debugged, can induce faults into the overall multiprocessing system.

Figure 2:
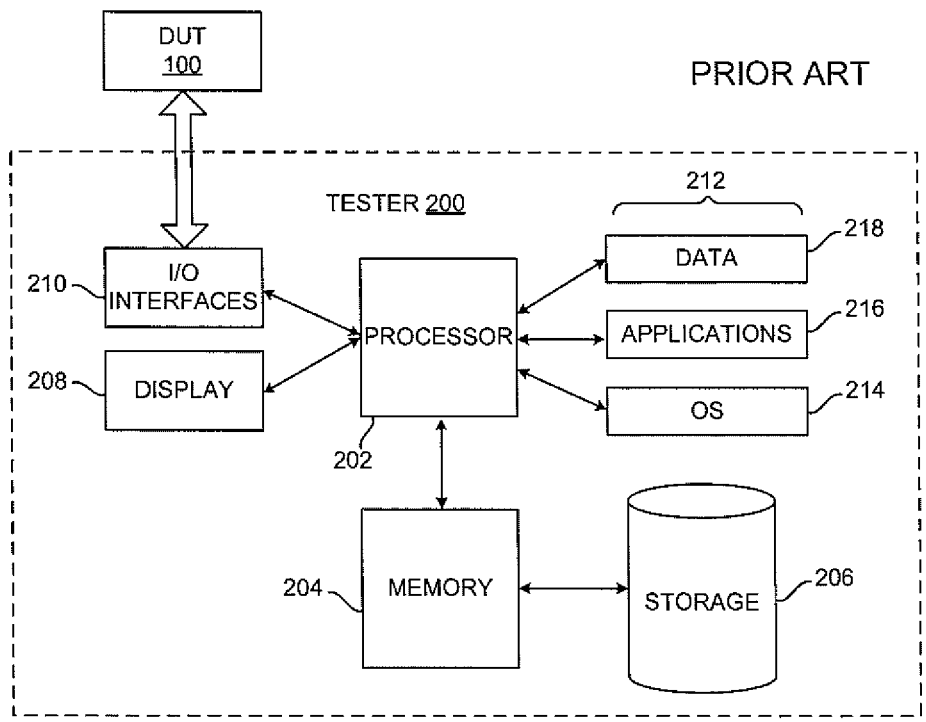
FIG. 2 is a schematic block diagram of conventional automatic test equipment connected to test the processor device of FIG. 1.

FIG. 2 is a schematic block diagram of automatic test equipment (ATE) 200 that can be used for testing a device under test (DUT) such as the processor device 100. The ATE 200 includes a processor 202 coupled to a memory 204 and additional memory or storage 206 coupled to the memory 204. The ATE 200 also includes a display device 208, input/output interfaces 210, and software 212. The software 212 includes operating system software 214, applications programs 216, and data 218. The applications programs 216 can include, among other elements, a test pattern generator for running test patterns which apply instructions to the DUT (e.g., processor 100) to stress the operation of the processor cores 102 and 124, the shared memory 112, 116, 118, 120 and 126 and the core interconnects such as MSS/BIU 122 and the bus 128 in order to test the operation of the multi-processing hardware design logic. The instructions may include irritator operations that constitute transaction-based stimuli of an instruction stream applied to the processor 100. The ATE 200 verifies the responses of the DUT to detect, analyze and diagnose any bugs.

The ATE 200 generally may be conventional except for the software used to test the coherency of data stored in the shared memory in the integrated circuit design. When software or a program is executing on the processor 202, the processor becomes a "means-for" performing the steps or instructions of the software or application code running on the processor 202. That is, for different instructions and different data associated with the instructions, the internal circuitry of the processor 202 takes on different states due to different register values, and so on, as is known by those of skill in the art. Thus, any means-for structures described herein relate to the processor 202 as it performs the steps of the methods disclosed herein.

Figure 3:
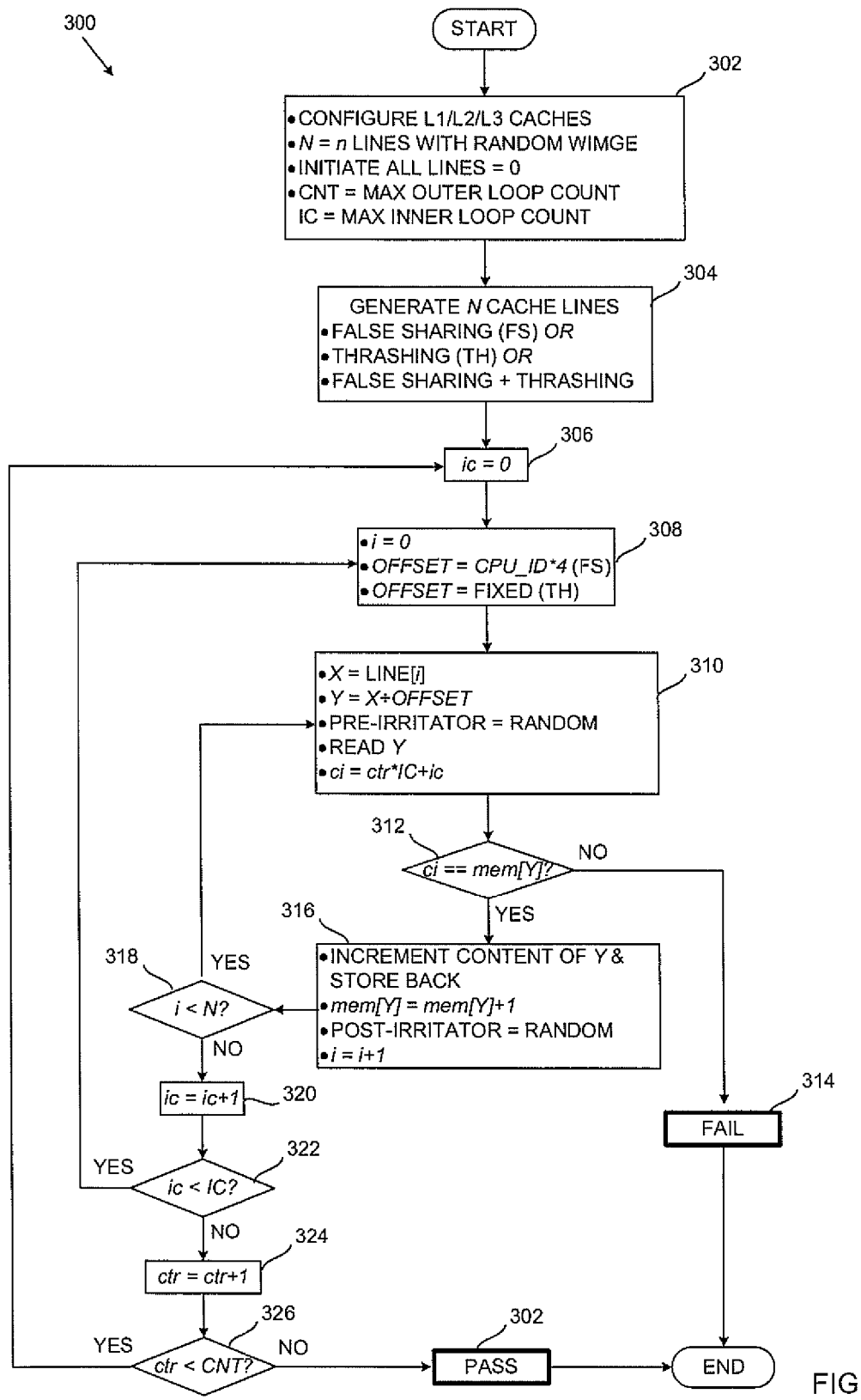
FIG. 3 is a flow chart of a method of testing the coherency of data storage in a processor device in accordance with an embodiment of the invention, given by way of example.

FIG. 3 illustrates a method 300 in accordance with an embodiment of the invention of testing the coherency of data stored in a memory shared by a plurality of processor cores through core interconnects in a DUT, such as the processor 100. The method 300 comprises running test patterns including data transactions between the processor cores and the shared memory, and comparing the results of the data transactions with expected results. The test patterns include false sharing operations and irritator operations causing memory thrashing.

An embodiment of the invention provides a non-transitory computer-readable storage medium storing instructions that, when executed by a test equipment, cause the test equipment to perform the method 300.

Figure 4:
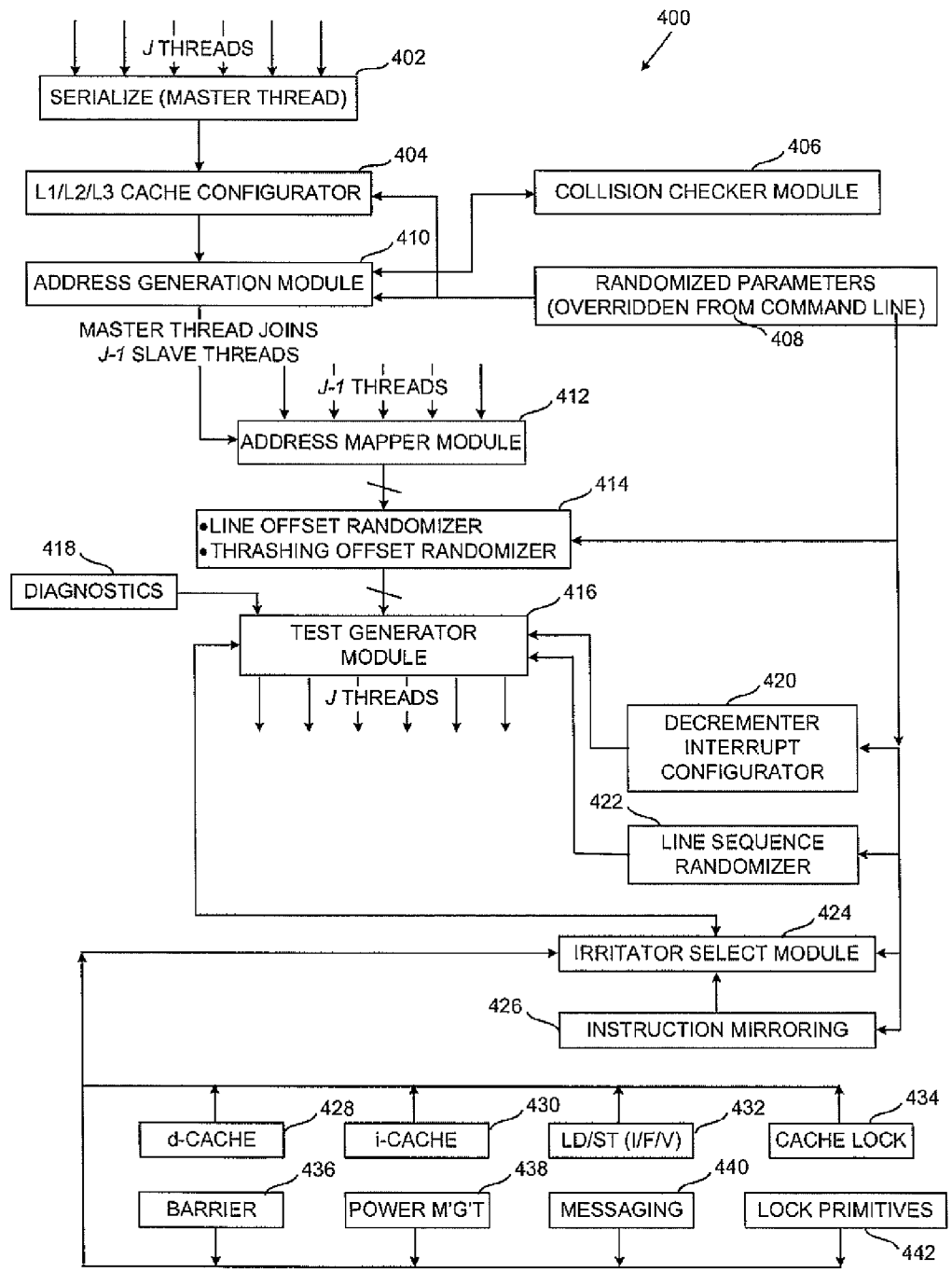
FIG. 4 is a schematic block diagram of modules in automatic test equipment in accordance with an embodiment of the invention, given by way of example.

FIG. 4 illustrates the functional modules of test equipment 400 in accordance with an embodiment of the invention for testing the coherency of data storage in a memory shared by a plurality of processor cores through core interconnects in a DUT, such as the processor 100. The functional modules may be run on the ATE 200. The test equipment 400 runs test patterns including data transactions between the processor cores and the shared memory, and compares the results of the data transactions with expected results. The test patterns include false sharing operations and irritator operations causing memory thrashing.

The method 300 and the test equipment 400 enable critical bugs to be reproduced (hit) more rapidly, with fewer test iterations. Test times can be reduced. A single test environment can consolidate tests on several sub-systems of the same processor device, such as caches, interconnects, bus masters and input/output (I/O) and address complex operational scenarios.

Figure 5:
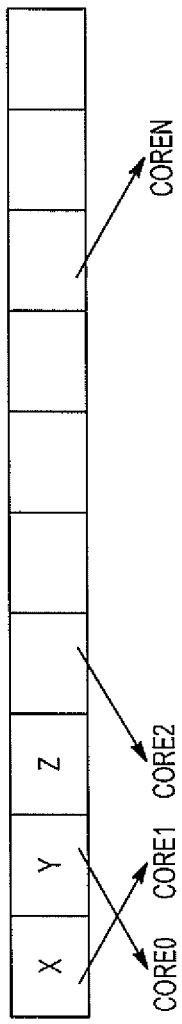
FIG. 5 is a diagram illustrating an example of the assignment of cells in a cache line during false sharing in the method of FIG. 3.

FIG. 5 illustrates diagrammatically an example of a case of false sharing. In false sharing, each cache line 500 is typically divided into small cells such as 502, 504, 506 to 508, which are assigned dynamically between each of the processor cores CORE0, CORE1, CORE2 to COREN, with each core selecting a unique offset within the cache line. The content of the data in the cells is illustrated by the letters X, Y, Z. The cells may be of 4 bytes or 8 bytes, for example, depending on the Computation Mode bit in the Machine State Register (MSR [CM]). If one cache line 500 is insufficient to hold the data for all cores, subsequent lines are allocated and are used as a single entity. Lock words may be allocated such that contention for the locks and updates to nearby data structures cause false indications of sharing that can occur due to the reservation granularity.

Figure 6:
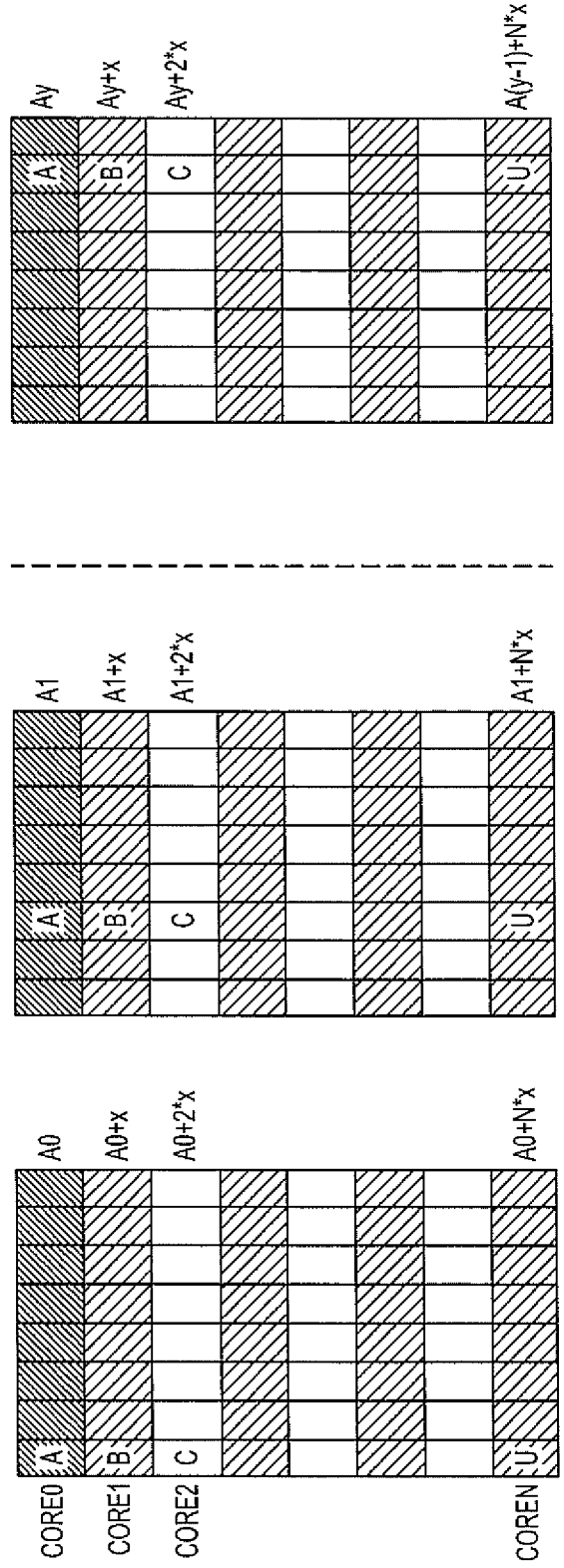
FIG. 6 is a diagram illustrating an example of the allocation of addresses during thrashing in the method of FIG. 3.

FIG. 6 illustrates diagrammatically an example of a case of thrashing for transactions between a cache and the main memory 126. $A_0$, $A_1$, to $A_{y-1}$ are real cache addresses with different tag IDs, but the same set numbers and offsets and x is the size of a single cache line. The successive processor cores, labeled here CORE0, CORE1 and so on to COREN access addresses that are displaced by one cache line (one set) from each other. Moreover, these addresses are all at the same fixed offset within their respective cache lines. The content of the data in the addresses is illustrated by the letters A, B, C to U. If y is such that y>n_ways in the cache (where n_ways is the maximum number of ways which can be allocated in the cache for data), then accessing each of the addresses $A_0$, $A_1$, ..., $A_y$ repeatedly will result in cache line thrashing. The higher the value of y relative to n, the greater is the effect of thrashing. Since consecutive cache lines are separated by a single set number, this will result in thrashing on cache lines owned by all the processor cores.

Thrashing may occur in normal operation where main memory is accessed in a pattern that leads to multiple main memory locations competing for the same cache lines. The result of cache line thrashing may be excessive cache misses, and repeated data swapping between different memory locations (especially main memory and caches). Cache thrashing may also occur where the translation look-aside buffer (TLB) is overrun by more requests than it can handle efficiently. In this test method, thrashing is provoked intentionally, to stress the shared memory and interconnects with the caches and processor cores.

At least some of the test patterns may include both false sharing operations and irritator operations causing memory thrashing.

The data transactions may include transactions with caches such as 112 and 116 in the processor cores 102, 124 as well as transactions with the shared memory 126. Irritators may include various core instructions which modify cache lines or cache line states either directly or indirectly and asynchronous interrupts, such as decrementer interrupts, for example.

At least some of the irritator operations may include powering down a processor core and wake-up using decrementer interrupts. At least some of the irritator operations may include input/output traffic, such as direct memory access for example.

In more detail, the example illustrated in FIG. 3 of a method 300 of testing the coherency of data storage in a shared memory runs in an outer loop, an inner loop and iterations. The outer loop is a run-time loop, whereas the inner loop is a compile-time loop for pattern generation and unrolling the sequence. At 302, the caches are configured. A master processor core configures a set of cache lines depending on various command line options (for example thrashing enabled, n_cache_lines and so on), creates translations for them and stores all information in a global hash table. The addresses for N cache lines of data are selected from various different pages with differing WIMGE attributes. WIMGE attributes refers to the following memory cache access attributes: W=Write-through, I=Cache-Inhibited, M=Memory Coherency, G=Guarded and E=Endianness (the terms endian and endianness, refer to how bytes of a data word are ordered within memory).

All the lines of the caches are initiated to zero. A maximum count for the outer loop is set to CNT. A maximum count for the inner loop is set to IC. The maximum counts CNT and IC enable the duration of the test to be defined.

All other cores (slave cores) wait for the master core to complete the step 302, then use the hash table to map exactly the same translations into their address space. Each core selects a unique offset within the cache lines for false sharing. If thrashing is enabled, the primary cache line is owned by the master core and subsequent cache lines are owned by the slave cores.

At 304, the sequences of instructions corresponding to the current line of the N lines of data are generated as false sharing (FS), thrashing (TH), or false sharing and thrashing (FS+TH). At 306 the current count ic of the inner loop is set to zero. At 308, a line count i is set to zero. An offset value is set, that for false sharing (FS) and for false sharing and thrashing (FS+TH) is equal to the core number multiplied by four (or eight, depending on the Computation Mode bit in the Machine State Register (MSR[CM])), and for thrashing (TH) is a constant value.

At 310, the address Y of the current line from the global list is set to the address X of the line number i plus the offset value. A choice is set randomly to perform or not a pre-irritator operation. After any pre-irritator operation, data is read from the address Y of the current line. A current iteration count ci is set to ctr*IC+ic, where ctr is the current outer loop count, IC is the maximum count of the inner loop, and ic is the current inner loop count.

At 312, the content of the address Y is compared with the expected value from a general purpose register in the relevant processor core such as 102 or 124 of the DUT. If the values are not the same, at 314 a fail is signaled and the test cycle ends. The point in the cycle where the fail occurs is identified and the instruction sequence causing the failure can be analyzed.

If at 312, the content of the address Y is the same as the expected value from the general purpose register in the processor core 102 or 124, at 316, the content at the address Y is incremented and stored back at the address Y. A choice is set randomly to perform or not a post-irritator operation, and the line count i is incremented. At 318, the line count i is compared with the total number of N cache lines of data selected. If i<N, the iteration reverts to step 310 and the iteration repeats with successive lines. If i=N, the inner loop count ic is incremented at 320 and compared with the maximum inner loop count N at 322.

If at 322, the inner loop count ic<IC, the maximum inner loop count, the process reverts to step 308 and the inner loop repeats. If at 322, the inner loop count ic is equal to IC, the current outer loop count ctr is incremented and compared with the maximum outer loop count CNT at 326. If at 326, the outer loop count ctr is less than the maximum outer loop count CNT, the process reverts to step 306 and the outer loop repeats. If at 326, the outer loop count ctr is equal to the maximum outer loop count CNT, a pass is signaled at 328 and the test cycle ends.

The pre-irritator and post-irritator operations if selected at steps 310 or 316 are snippets issued on the current cache address and which may be single instructions or groups of instructions. Examples of instructions which may be used in irritator operations are:

data cache instructions such as Data Cache Block Flush (dcbf), Data Cache Block Store (dcbst), Data Cache Block Touch for Store (dcbtst), Data Cache Block Touch (dcbt), Data Cache Block Invalidate (dcbi);

instruction cache instructions such as Instruction Cache Block Touch (icbt), Instruction Cache Block Invalidate (icbi);

load indexed instructions such as Load Byte and Zero Indexed (lbzx), Load Half Word and Zero Indexed (lhzx), Load Word and Zero Indexed (lwzx), Load Doubleword Indexed (ldx);

load floating point instructions such as Load Floating-Point Double Indexed (lfdx), or Single Indexed (lfsx);

load Altivec instructions such as Load Vector Element Byte Indexed (lvehx), Load Vector Element Half Word Indexed (lvehx), Load Vector Element Word Indexed (lvewx), Load Vector Indexed (lvx), and Load Vector Indexed LRU (lvxl), for example;

atomic instructions such as Load Byte and Reserve Indexed (lharx), Load Halfword and Reserve Indexed (lharx), Load Word and Reserve Indexed (lwarx), Load Doubleword and Reserve Indexed (ldarx), Store Byte Conditional Indexed (stbcx), Store Halfword Conditional Indexed (sthcx), Store Word Conditional Indexed (stbcx), Store Doubleword Conditional Indexed (stdcx);

data cache lock instructions such as Data Cache Block Touch and Lock Set (dcbtls), Data Cache Block Touch for Store and Lock Set (dcbtstls), Data Cache Block Lock Clear (dcblc), Data Cache Block Lock Query (dcblq);

instruction cache lock instructions such as Instruction Cache Block Touch and Lock Set (icbtls), Instruction Cache Block Lock Clear (icblc), Instruction Cache Block Lock Query (icblq);

barriers such as Synchronize (msync), Memory Barrier (mbar), Instruction Synchronize (isync); and processor signaling instructions such as Message Send (msgsnd).

The irritators may be self-irritators that do not change the data on the false-shared address, only the cache line state. Alternatively, the irritators may be peer irritators, in which one thread irritates other threads, by modifying their cache line offset under control of lock primitives (reservation instructions). Asynchronous interrupts may act as an external irritator source. Bus masters such as a direct memory access (DMA) engine may act as external irritator source by congesting the interconnect traffic and/or the interfering cache sub-system along with stashing.

FIG. 4 illustrates software modules in automatic test equipment (ATE) 400 in an embodiment of the invention. A module 402 receives J threads and serializes them to form a master thread for the test instructions. A module 404 controlled by the master thread configures the L1, L2 and L3 caches such as 112, 116 and 118, 120.

A collision checker 406 performs collision and sanity checks on addresses generated by the address generator module and works in conjunction with an address generator module 410. A module 408 generates pseudo-randomized parameters that can be overridden from the command line. An address generation module 410 receives pseudo-randomized parameters from the module 408 and the collision checker input. The master thread then joins the J-1 slave threads and the J resulting threads are passed to an address mapping module 412. A line offset and thrashing offset randomizer 414, that receives pseudo-randomized parameters from the module 408, adds the offsets to the mapped addresses.

A test generator module 416 receives the resulting addresses, an input from a diagnostics module 418 and inputs from a decrementer interrupt configurator 420 and a line sequence randomizer 422, which are controlled by pseudo-randomized parameters from the module 408. The test generator module 416 also receives irritator operations from an irritator select module 424 that receives inputs from an instruction mirroring module 426. The module 426 decides if the same irritator sequence or different irritator sequences are to be generated on all threads (cores). The irritator select module 424 and the instruction mirroring module 426 are controlled by pseudo-randomized parameters from the module 408.

Operations that can be used as irritator operations, selected by the irritator select module 424, are generated by a data cache operation module 428, an instruction cache operation module 430, a load/store operation module 432, a cache lock operation module 434, a barrier operation module 436, a power management operation module 438, a messaging operation module 440, and a lock primitives operation module 442.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of testing coherency of data storage in a memory shared by a plurality of processor cores through core interconnects in a device under test (DUT), wherein the processor cores includes caches, the method comprising:
   running test patterns including data transactions between the processor cores and the shared memory; and
   comparing results of the data transactions with expected results,
   wherein the test patterns cause memory thrashing,
   wherein the data transactions include transactions with the caches as well as transactions with the shared memory, and
   wherein at least some of the test patterns include irritator operations having interrupts that modify cache lines or cache line states indirectly.

2. The method of claim 1, wherein the test patterns include both false sharing operations and the irritator operations for causing the memory thrashing.

3. The method of claim 1, wherein at least some of the irritator operations have core instructions that the modify cache lines or the cache line states.

4. The method of claim 1, wherein at least some of the test patterns cause cache line thrashing.

5. The method of claim 2, wherein at least some of the irritator operations include powering down a processor core and wake-up using decrementer interrupts.

6. The method of claim 2, wherein at least some of the irritator operations include input/output traffic.

7. A test equipment for testing coherency of data storage in a memory shared by a plurality of processor cores through core interconnects in a device under test (DUT), wherein the processor cores include caches, the test equipment comprising:
   means for running test patterns in the DUT including data transactions between the processor cores and the shared memory, and
   means for comparing results of the data transactions with expected results,
   wherein the test patterns include at least one of false sharing operations and irritator operations for causing memory thrashing, and
   wherein at least some of the irritator operations have interrupts that modify cache lines or cache line states indirectly.

8. The test equipment of claim 7, wherein at least some of the test patterns include both the false sharing operations and the irritator operations that cause memory thrashing.

9. The test equipment of claim 7, wherein the data transactions include transactions with the caches as well as transactions with the shared memory.

10. The test equipment of claim 7, wherein at least some of the irritator operations have core instructions which modify cache lines or cache line states.

11. The test equipment of claim 7, wherein at least some of the test patterns cause cache line thrashing.

12. A non-transitory computer-readable storage medium storing instructions that, when executed by a test equipment, cause the test equipment to perform a method of testing coherency of data storage in a memory shared by a plurality of processor cores through core interconnects in a device under test (DUT), the method comprising:
   running test patterns in the DUT including data transactions between the processor cores and the shared memory, and comparing results of the data transactions with expected results;
   wherein the test patterns include false sharing operations and irritator operations that cause memory thrashing,
   wherein the processor cores include caches, and the data transactions include transactions with the caches as well as transactions with the shared memory, and
   wherein at least some of the irritator operations include interrupts that modify cache lines or cache line states indirectly.

13. The non-transitory computer-readable storage medium of claim 12, wherein at least some of the test patterns include both the false sharing operations and the irritator operations that cause memory thrashing.

14. The non-transitory computer-readable storage medium of claim 12, wherein at least some of the irritator operations include core instructions that modify cache lines or cache line states.

15. The non-transitory computer-readable storage medium of claim 12, wherein at least some of the test patterns cause cache line thrashing.

* * * * *